(12) United States Patent
Delpech et al.

(10) Patent No.: US 6,501,151 B1
(45) Date of Patent: Dec. 31, 2002

(54) INTEGRATED CAPACITOR WITH A MIXED DIELECTRIC

(75) Inventors: Philippe Delpech, Meylan (FR); Vincent Arnal, Saint Cirgues (FR); Sandra Lis, La Tronche (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/714,027

(22) Filed: Nov. 15, 2000

(30) Foreign Application Priority Data

Nov. 18, 1999 (FR) ............................................. 99 14486

(51) Int. Cl.[7] .............................................. H01L 29/76
(52) U.S. Cl. ........................................ 257/532; 257/411
(58) Field of Search .................................. 257/411, 532, 257/310

(56) References Cited

U.S. PATENT DOCUMENTS 3,422,321 A * 1/1969 Tombs ......................... 257/411
5,162,258 A   11/1992 Lemnios et al. ............. 437/184

OTHER PUBLICATIONS

Patent Abstracts of Japan, vol. 1995, No. 09, Oct. 31, 1995 & JP 07 161709 A (NEC Corp), Jun. 23, 1995.
Okamoto Y Et Al: "Fowler–Nordheim Current–Stress Resistance of SI Oxynitride Grown in Helicon–Wave Excited Nitrogen–Argon Plasma" Journal of Applied Physics, US, American Institute of Physics. New York, vol. 82, No. 8, Oct. 15, 1997, pp. 4108–4114, XP000752423.

Viard J Et Al: "XPS and FTIR Study of Silicon Oxynitride Thin Films" Journal of the European Ceramic Society, GB, Elsevier Science Publishers, Barking, Essex, vol. 17, No. 15–16, 1997, pp. 2025–2028, XP004101573.

Database Inspec 'en ligne! Institute of Electrical Engineers, Stevenage, GB; Hajji B Et Al: "Electrical Characterisation of Thin Silicon Oxynitride Films Deposited by Low Pressure Chemical Vapour Deposition" Database Accession No. 6449528 XP002144515, Oct. 8, 1999, Elsevier, Switzerland, vol. 354, No. 1–2, pp. 9–12, ISSN: 0040–6090.

* cited by examiner

*Primary Examiner*—Mark V. Prenty
(74) *Attorney, Agent, or Firm*—Lisa K. Jorgenson; Allen, Dyer, Doppelt, Milbrath & Gilchrist, P.A.

(57) ABSTRACT

An integrated circuit capacitor includes a substrate, a first metal electrode on the substrate, and a dielectric layer on the first metal electrode. The dielectric layer includes a homogeneous combination of at least two dielectric materials having permittivities varying in an opposite way based upon an electric field, with a proportion of each dielectric material being chosen so that the integrated circuit capacitor has a desired voltage linearity. A second metal electrode is on the dielectric layer.

11 Claims, 2 Drawing Sheets

INTEGRATED CAPACITOR WITH A MIXED DIELECTRIC

FIELD OF THE INVENTION

The present invention relates to integrated circuits, and, more particularly, to an integrated capacitor on a silicon substrate.

BACKGROUND OF THE INVENTION

It is common practice to design integrate circuits with one or more high value integrated capacitors, which advantageously replace conventional discrete capacitors. Integrated capacitors have various applications in the field of analog and RF circuits. These applications include filtering supply voltages in resonant antenna circuits, for example.

Among the known integrated capacitors, capacitors with metal electrodes have several advantages when compared to capacitors with polysilicon electrodes. Metal electrodes have an excellent electrical conductivity, whereas polysilicon electrodes need a silicide formation process in the presence of a metal like tungsten or titanium to have the same effect.

Capacitors with metal electrodes are very easy to manufacture. The lower electrode is generally made from one of the last metal layers of the integrated circuit, such as the metal layer used to make conductive tracks, for example. Compared to conventional methods of manufacturing integrated circuits, the design of a capacitor with metal electrodes only needs a step of depositing a dielectric layer on a pre-existing metal layer that is used as a first electrode layer, and a step of depositing a second electrode metal layer thereon. The dielectric layer is deposited at a moderate temperature of about 400° C. so that the metal layer of the first electrode is not damaged. Capacitors with metal electrodes have a small parasitic capacitance with respect to the silicon substrate because they are made, as just described, on one of the last levels of the integrated circuit.

However, capacitors with metal electrodes present a poor voltage linearity. The voltage linearity is defined by the ratio $\Delta C/C$, where C is the value of the capacity at a voltage equal to zero and $\Delta C$ is the variation of the capacity C according to the applied voltage. The ratio $\Delta C/C$ of a capacitor with metal electrodes is typically on the order of 200 $10^{-6}$/V, i.e., a linearity defect that is at least 10 times above the value which is generally tolerated by designers of analog integrated circuits.

For this reason, capacitors with metal electrodes have at present only a few applications in the field of analog and RF circuits in spite of the advantages as discussed above. After various studies, the inventors of the present invention have hypothesized that the non-linearity phenomenon, which appears only in capacitors with polysilicon electrodes, is linked to the fact that the dielectric is deposited at a moderate temperature. This results in the incorporation of many impurity atoms (H, N, C . . . ) and the creation of many interface states, generally taking the form of pending linkages.

Furthermore, capacitors with metal electrodes, unlike capacitors with polysilicon electrodes, are not subject to a high temperature anneal. A high temperature anneal is conventionally performed with a temperature on the order of 850° C. during several tens of minutes. In the manufacturing process of integrated circuits, conventional annealing steps for dopant activation are always performed before depositing the metal layers to avoid damaging them.

Thus, it appears that the poor voltage linearity of capacitors with metal electrodes is linked to the presence of impurities in the dielectric and/or to an incomplete formation of the dielectric that a high temperature annealing causes to partly disappears. This is confirmed by equations (1) to (3), which respectively provides the value of an electric capacity C as a function of the absolute permittivity $\in$ of the dielectric, and the value of the permittivity $\in$ of the dielectric as a function of the voltage V or the electric field E applied to the capacitor. The three equations are as follows:

$$C = \in {}^{*} S/d \quad (1)$$

$$\in = \in_0 + A + B^{*}E^2 \quad (2)$$

$$\in = \in_0 + A + B^{*}V^2/d^2 \quad (3)$$

The variable S is the surface of the electrodes of the capacitor, d is the distance between the electrodes or a thickness of the dielectric, $\in_0$ is the permittivity of the vacuum, A is a constant and B is a quadratic term multiplied by the square of the applied voltage.

It is clear that the variations of a capacity according to voltage are due to variations of the permittivity $\in$ of its dielectric, and, more particularly, to the existence of the quadratic term B. The quadratic term B is generally very small compared to the constant A.

However, the thickness d of the dielectric of an integrated capacitor is very small, e.g., on the order of some tens of nanometers, and supports a voltage of a few volts. In these conditions, the electric field E, equal to V/d, is very high and the effect of the quadratic term is no longer negligible. For example, a capacitor having a dielectric with a thickness of 30 nm subject to a voltage of 3V supports a very high electric field of $10^8$V/m.

SUMMARY OF THE INVENTION

In view of the foregoing background, it is an object of the present invention to provide an integrated capacitor presenting a satisfactory voltage linearity without necessarily requiring a high temperature anneal, as well as a method of manufacturing the capacitor.

Another object of the present invention is to provide a low temperature dielectric having a quadratic term as small as possible, and a manufacturing method of such a dielectric.

These and other objects, features and advantages are provided by a dielectric comprising a homogeneous combination of molecules of at least two dielectrics having permittivities varying in an opposite way according to the electric field. The proportion of each dielectric in the combination is chosen so that the combination presents a permittivity that is less sensitive to the electric field.

According to one embodiment, the dielectric comprises $SiO_xN_y$, with x being different from y.

The present invention also relates to a capacitor integrated on a silicon substrate. The capacitor preferably comprises layers of first and second electrodes, and a dielectric layer therebetween.

The dielectric layer comprises a homogeneous combination of molecules of at least two dielectrics having permittivities varying in an opposite way according to the electric field. The proportion of each dielectric in the combination is chosen so that the capacitor presents a satisfactory voltage linearity.

According to one embodiment, the dielectric is of the $SiO_xN_y$ type, with x being different from y. The material forming the layers of first and second electrodes is preferably chosen from the group comprising aluminium, copper, tungsten, titanium, titanium nitride and their alloys.

The invention also relates to a method of manufacturing a capacitor integrated on a silicon substrate. The method comprises depositing a first electrode layer, depositing a dielectric layer, and depositing a second electrode layer. Depositing the dielectric layer comprises depositing a homogeneous combination of molecules of at least two dielectrics having permittivities varying in an opposite way according to the electric field. The proportion of each dielectric in the combination is chosen so that the capacitor presents a satisfactory voltage linearity.

According to one embodiment, the two combined dielectrics are silicon oxide and silicon nitride. The dielectric comprises a composition of $SiO_xN_y$, with x being different from y. The proportion of each dielectric in the combination is determined by preliminary experiments by observing the voltage linearity of test capacitors comprising various dielectric proportions.

The dielectric is preferably deposited under vapor phase, and the proportion of each dielectric in the combination is in particular determined by an adjustment of the gaseous rates of the gases forming each of the dielectrics of the combination. The layers of the first and second electrodes are preferably made of a material chosen from the group comprising aluminium, copper, tungsten, titanium, titanium nitride and their alloys.

BRIEF DESCRIPTION OF THE DRAWINGS

These objects, characteristics and advantages of the invention will be illustrated with more details in the following description of a manufacturing method of a dielectric according to the invention, and by a capacitor comprising such a dielectric, in conjunction with the accompanying drawings in which.

DETAILED DESCRIPTION OF THE PREFERRED EMBODIMENTS

The present invention is based on the observation that some dielectrics have permittivities which vary in an inverse way according to the applied voltage. Such an observation comes from a comparison of the two most commonly used dielectrics in the semi-conductor industry, i.e., silicon oxide $SiO_2$ and silicon nitride SiN. To better understand the present invention, FIGS. 1 and 2 respectively illustrate two graphs A1 and A2 showing the variations versus voltage V of a silicon oxide capacitor C1 and a silicon nitride capacitor C2. Graphs A1 and A2 are opposed to one another in the form of parabolas. The two branches of graph A1 are oriented downwards, whereas the branches of graph A2 are oriented upwards.

To explain this phenomenon, the quadratic term B of a dielectric (ref. equations 2 and 3) is defined as the resultant of two terms $B_{ani}$ and $B_{pol}$ which depend on microscopic quantities of the dielectric:

$$B = (B_{ani} - B_{pol}) \quad (4)$$

The variable $B_{ani}$ represents the contribution of the molecular anisotropy of the dielectric, and $B_{pol}$ represents the contribution of the permanent dipoles of the dielectric. This is due to the fact that, under the action of an electric field, the dielectric is polarized and several effects add together, such as ionic polarization, electron polarization and dipolar polarization. These effects are particularly appreciable with low temperature dielectrics which have not been subject to a thermal anneal.

Figure 1:
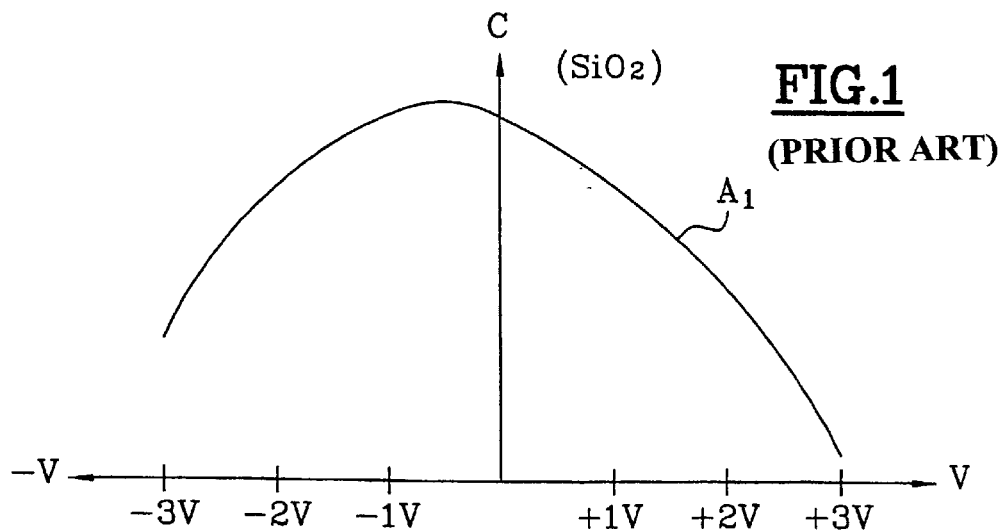
FIG. 1 is a graph illustrating voltage non-linearity of a conventional silicon oxide capacitor according to the prior art.
Figure 2:
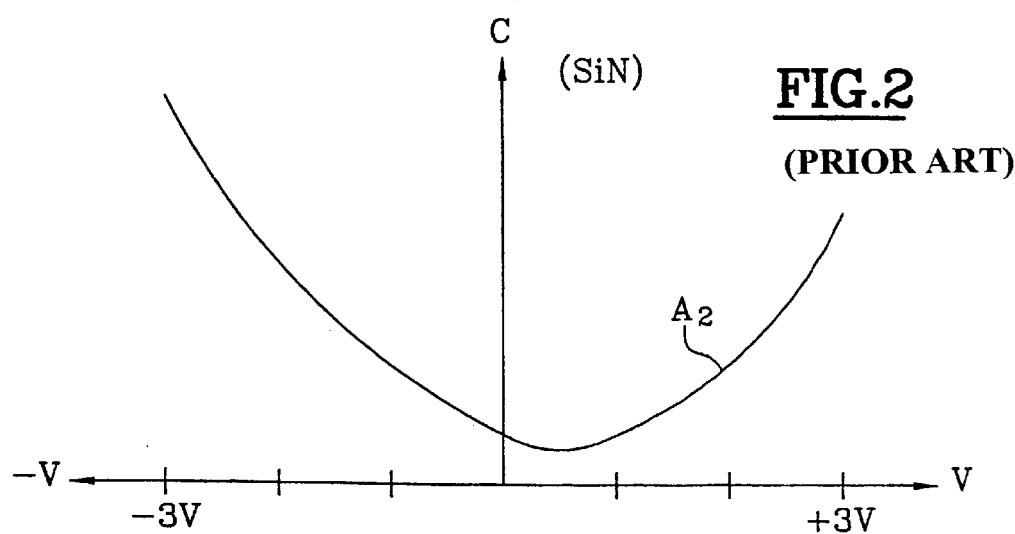
FIG. 2 is a graph illustrating voltage non-linearity of a conventional silicon nitride capacitor according to the prior art.

Thus, some dielectrics have a term $B_{ani}$ which is predominant over the term $B_{pol}$, and other dielectrics have a term $B_{pol}$ which is predominant over the term $B_{ani}$. In particular, the graphs A1 and A2 of FIGS. 1 and 2 show that silicon oxide presents a negative quadratic term B when silicon nitride presents a positive quadratic term B.

Using this observation, the idea of the present invention is to combine two dielectrics having quadratic terms B with opposite signs in order to obtain a dielectric having a resulting quadratic term as small as possible. More particularly, the present invention provides a mixed dielectric comprising a homogeneous combination of molecules of at least two dielectrics having quadratic terms B with opposite signs. This is obtained by mixing the gaseous components of these dielectrics during the formation of the mixed dielectric.

By way of a non-limiting example, application of the invention to the design of an integrated capacitor having a low temperature dielectric $SiO_xN_y$ resulting from the combination of molecules of silicon oxide $SiO_2$ and silicon nitride SiN will now be described.

Figure 3A:
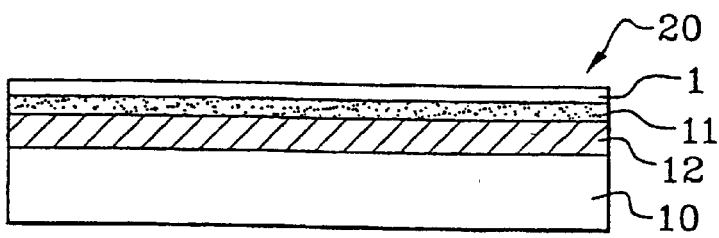
FIGS. 3A to 3D respectively illustrate cross-sectional views of an integrated capacitor based upon manufacturing steps according to the present invention.

FIG. 3A illustrates a partial cross-sectional view of an integrated circuit during its manufacture. In particular, a section of the integrated circuit is illustrated where a capacitor 20 with metal electrodes is to be formed. At this manufacturing stage, capacitor 20 only comprises a metal layer of a first electrode 1 deposited on a silicon substrate 10 over an electrically insulating layer 11. As mentioned above, this layer of the first electrode 1 is, for example, one of the last metal layers of the integrated circuit, such as Metal Layer 4, Metal Layer 5, or Metal Layer 6, for example. This depends on the structure of the integrated circuit and the number of conductive levels that it comprises. Thus, between the layer of the first electrode 1 and the substrate itself, there may be other integrated circuit layers. In particular, the metal layers may be separated by insulating layers, which are schematically represented by the cross-hatched region 12.

Figure 3B:
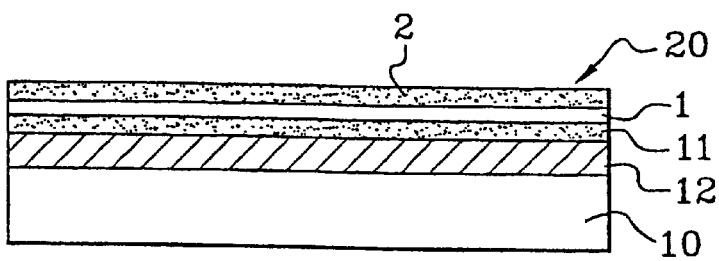

The metal layer of the first electrode 1, for example, is made of aluminium Al. This metal layer is conventionally deposited under a vacuum using a metal vapor. The step illustrated in FIG. 3B comprises the deposition of a dielectric layer 2 having a composition comprising $SiO_xN_y$ on the layer of the first electrode 1. The deposition of the dielectric $SiO_xN_y$ is performed using a conventional Plasma Enhanced Chemical Vapor Deposition (PECVD) technique in a standard industrial reactor. For example, the reactor sold with the reference DXZ by the firm Applied Materials may be used.

The deposition is performed under vacuum at a temperature on the order of 400° C. in presence of a plasma by combining the gases which are conventionally used for depositing silicon oxide $SiO_2$ and the gases which are conventionally used for depositing silicon nitride SiN. These gases are, for example, silane $SiH_4$ and gas $N_2O$ for the deposition of silicon oxide $SiO_2$. A complex molecule like Tetra-Ethyl-Ortho-Silicate (TEOS) may also be used. Other gases include silane $SiH_4$, ammonia $NH_3$ and nitrogen $N_2$ for the deposition of silicon nitride SiN. Thus, the gaseous mixture in the PECVD chamber comprises the gases $SiH_4$, $N_2O$, $NH_3$ and $N_2$.

In practice, the adjustment of the stoichiometric quantities x and y of the dielectric $SiO_xN_y$ depends mainly on the rates of the component gases $SiH_4$, $N_2O$, $NH_3$, $N_2$ in the reactor, and secondly on various other parameters like pressure, temperature, plasma and intensity. Preferably, the secondary parameters are fixed, and the stoichiometric quantities x and y are adjusted by the gas rates.

Before starting a mass production of capacitors according to the present invention, the above-mentioned parameters are experimentally determined by performing a series of tests. This series of tests comprises designing various test capacitors which are used to search for the dielectric $SiO_xN_y$ that is the most stable according to the electric field. This is determined by analyzing the voltage linearity of the various test capacitors. When the dielectric has been determined, the parameters of the PECVD deposition of this dielectric are recorded and used in the industrial process.

Capacitors made with this dielectric have a voltage linearity brought back to satisfactory values on the order of 15 $10^{-6}/V$. This is a decrease by a factor 10 of the non-linearity observed with conventional capacitors with silicon oxide $SiO_2$, silicon nitride SiN, or silicon oxinitride SiON.

Figure 3C:
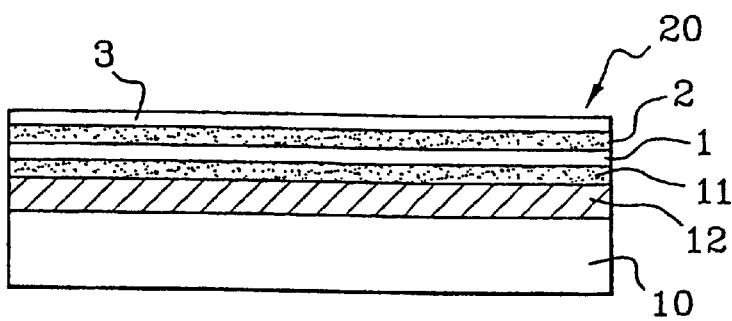

As illustrated in FIG. 3C, a metal layer of the second electrode 3, the composition of which may be identical to the composition of the layer of the first electrode 1, is deposited on the dielectric layer 2. The layer of the first electrode 1 conventionally has a thickness on the order of 500 nanometers, the dielectric layer 2 has a thickness on the order of some tens of nanometers, and the layer of the second electrode 3 has a thickness on the order of 150 nanometers.

Figure 3D:
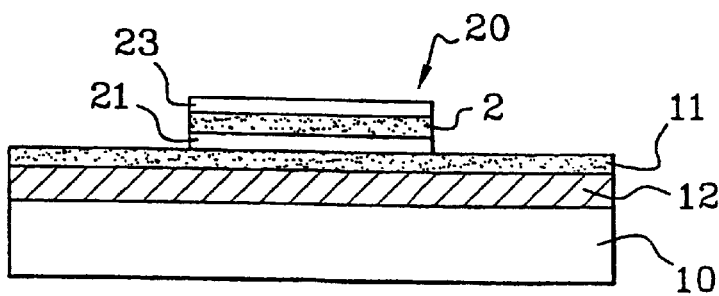

As illustrated in FIG. 3D, the layers 1 and 3 of the first and second electrodes are then etched, beginning with the layer of second electrode 3 to provide a capacitor structure 20 having electrodes 21 and 23 with desired sizes. The area of the electrodes 21 and 23 may vary. This variation may be according to the desired value of the capacity, and may range from one square micrometer to one square millimeter.

Figure 4:
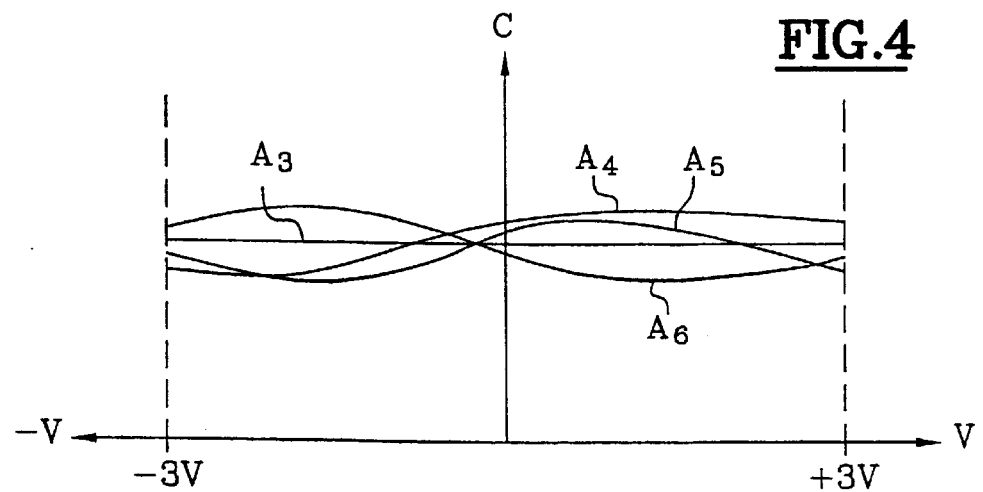
FIG. 4 is a graph illustrating voltage non-linearity of an integrated capacitor according to the present invention.

In a general way, a capacitor according to the present invention presents a graph C=f(V) that is not very sensitive to the voltage V resulting from the combination of the parabolic graphs A1 and A2 represented in FIGS. 1 and 2. This graph is, for example, one of the graphs A4, A5, and A6 represented in FIG. 4, which remains close to the ideal flat graph A3 of a capacitor having a perfect dielectric. In addition to aluminium A1, the layers of the first and second electrodes may be formed using various known metals or alloys, such as aluminium-copper Al—Cu, copper Cu, tungsten W, titanium Ti, titanium nitride TiN, and their alloys.

Furthermore, although the present invention has been implemented to solve the non-linearity problem of capacitors with metal electrodes comprising a low temperature dielectric which has not been subject to a thermal processing, there is found in the foregoing a general teaching applicable to any type of capacitor.

It is thus conceivable with the present invention to design capacitors with polysilicon electrodes while suppressing the conventional thermal processing step, or limiting the duration of the thermal processing step, which is costly in terms of equipment and duration of the manufacturing process.

The present invention is also applicable to capacitors for MOS transistors, capacitors for DRAM memory cells, and capacitors for EEPROM memory cells.

It is also within the scope of the present invention and within those skilled in the art to extend the experimentation field of the present invention to other known dielectrics by combination of two, even three or four dielectrics, and comparing the permittivity graphs of the dielectrics. In addition to tantalum pentoxide $Ta_2O_5$, silicon oxinitride SiON may be considered as a possible component of a dielectric combination according to the present invention.

That which is claimed is:

1. An integrated circuit capacitor comprising:
   a substrate;
   a first metal electrode on said substrate;
   a dielectric layer on said first metal electrode and comprising a combination of silicon oxide and silicon nitride to form $SiO_xN_y$, with a proportion of the silicon oxide and silicon nitride being chosen so that the integrated circuit capacitor has a voltage linearity less than about $15 \times 10^{-6}/V$; and
   a second metal electrode on said dielectric layer.

2. An integrated circuit capacitor according to claim 1 wherein said substrate comprises silicon.

3. An integrated circuit capacitor according to claim 1 wherein x is different from y.

4. An integrated circuit capacitor according to claim 1 wherein each of said first and second metal electrodes comprises at least one of aluminum, copper, tungsten, titanium, titanium nitride and alloys thereof.

5. An integrated circuit capacitor comprising:
   a substrate;
   a first metal electrode on said substrate;
   a dielectric layer on said first metal electrode and comprising a homogeneous combination of at least two dielectric materials having permittivities varying in an opposite way based upon an electric field, with a proportion of each dielectric material being chosen so that the integrated circuit capacitor has a voltage linearity less than about $15 \times 10^{-6}/V$; and
   a second metal electrode on said dielectric layer.

6. An integrated circuit capacitor according to claim 3 wherein said substrate comprises silicon.

7. An integrated circuit capacitor according to claim 3 wherein said dielectric layer comprises at least two of silicon oxide, silicon nitride, silicon oxinitride and tantalum pentoxide.

8. An integrated circuit capacitor according to claim 3 wherein each of said first and second metal electrodes comprises at least one of aluminum, copper, tungsten, titanium, titanium nitride and alloys thereof.

9. A dielectric layer for an integrated circuit capacitor and comprising:
   a homogeneous combination of at least two dielectric materials having permittivities varying in an opposite way based upon an electric field, with a proportion of each dielectric material being chosen so that the integrated circuit capacitor has a voltage linearity less than about $15 \times 10^{-6}/V$.

10. A dielectric layer according to claim 9 wherein said homogeneous combination comprises $SiO_xN_y$, with x being different from y.

11. A dielectric layer according to claim 9 wherein said homogeneous combination comprises at least two of silicon oxide, silicon nitride, silicon oxinitride and tantalum pentoxide.

* * * * *